US 6,727,703 B2

(12) United States Patent
Lee

(10) Patent No.: US 6,727,703 B2
(45) Date of Patent: Apr. 27, 2004

(54) METHOD AND APPARATUS FOR DECOUPLING RF DETECTOR ARRAYS FOR MAGNETIC RESONANCE IMAGING

(75) Inventor: Ray Fli Lee, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/063,843

(22) Filed: May 17, 2002

(65) Prior Publication Data

US 2003/0214301 A1 Nov. 20, 2003

(51) Int. Cl.$^7$ .................................................. G01V 3/00
(52) U.S. Cl. ........................................ 324/322; 324/319
(58) Field of Search ................................ 324/307, 309, 324/312, 318, 322, 300; 600/410, 421, 422

(56) References Cited

U.S. PATENT DOCUMENTS

| | | | | |
|---|---|---|---|---|
| 4,769,605 A | * | 9/1988 | Fox ........................... | 324/322 |
| 4,825,162 A | | 4/1989 | Roemer et al. ............. | 324/318 |
| 5,144,241 A | * | 9/1992 | Oppelt et al. ............... | 324/318 |
| 6,289,232 B1 | * | 9/2001 | Jakob et al. ................. | 600/410 |
| 6,369,550 B1 | | 4/2002 | Lou et al. ................... | 323/208 |

OTHER PUBLICATIONS

KP Pruessmann, M Weiger, M Scheidegger, P Doesiger, "SENSE: Sensitivity Encoding for Fast MRI," Magnetic Resonance in Medicine 42:952–962 (1999).

RF Lee, CR Westgate, RG Weiss, DC Newman, RA Bottomley, "Planar Strip Array (PSA) for MRI," Magnetic Resonance in Medicine 45:673–683 (2001).

Patent Application, "Multiple Channel, Microstrip Transceiver Volume Array For Magnetic Resonance Imaging," Ser. No. 10/063,223, filed Apr. 1, 2002 by GE Medical Systems.

WE Kyriakos, LP Panych, DF Kacher, C–F Westin, SM Bao, RV Mulkern, FA Jolesz, "Sensitivity Profiles From An Array Of Coils For Encoding and Reconstruction In Parallel (SPACE RIP)," Magnetic Resonance in Medicine 44: 301–308 (2000).

* cited by examiner

Primary Examiner—Brij B. Shrivastav
(74) Attorney, Agent, or Firm—Jean K. Testa; Patrick K. Patnode

(57) ABSTRACT

A radio frequency (RF) detector array assembly for use in a magnetic resonance imaging (MRI) system comprises at least one RF detector array, wherein the array has a plurality of RF detector elements for use in simultaneously acquiring radio frequency (RF) signals from the MRI system, and, a decoupling interface coupled to each of the plurality of detector elements for decoupling each detector element from the remaining detector elements. A method for decoupling radio frequency (RF) detector array elements in a magnetic resonance imaging (MRI) system is provided. The method comprises the steps of providing at least one RF detector array, wherein the detector array has a plurality of RF detector elements, and, providing a decoupling interface coupled to each of the plurality of detector elements for decoupling each detector element from the remaining detector elements.

14 Claims, 7 Drawing Sheets

METHOD AND APPARATUS FOR DECOUPLING RF DETECTOR ARRAYS FOR MAGNETIC RESONANCE IMAGING

BACKGROUND OF INVENTION

This invention relates generally to magnetic resonance imaging (MRI), and more particularly, to decoupling radio frequency (RF) detector arrays used for MRI.

Generally, MRI is a well-known imaging technique. A conventional MRI device establishes a homogenous magnetic field, for example, along an axis of a person's body that is to undergo MRI. This homogeneous magnetic field conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei precess about the axis of the magnetic field and emit electromagnetic signals that may be detected by one or more coils placed on or about the person.

The frequency of the magnetic resonance (MR) signal emitted by a given precessing nucleus depends on the strength of the magnetic field at the nucleus' location. As is well known in the art, it is possible to distinguish radiation originating from different locations within the person's body by applying a field gradient to the magnetic field across the person's body. For the sake of convenience, direction of this field gradient may be referred to as the left-to-right direction. Radiation of a particular frequency may be assumed to originate at a given position within the field gradient, and hence at a given left-to-right position within the person's body. The application of such a field gradient is also referred to as frequency encoding.

However, the application of a field gradient does not allow for two-dimensional resolution, since all nuclei at a given left-to-right position experience the same field strength, and hence emit radiation of the same frequency. Accordingly, the application of a frequency-encoding gradient, by itself, does not make it possible to discern radiation originating from the top versus radiation originating from the bottom of the person at a given left-to-right position. Resolution has been found to be possible in this second direction by application of gradients of varied strength in a perpendicular direction to thereby perturb the nuclei in varied amounts. The application of such additional gradients is also referred to as phase encoding.

Frequency-encoded data sensed by the coils during a phase encoding step is stored as a line of data in a data matrix known as the k-space matrix. Multiple phase encoding steps are performed in order to fill the multiple lines of the k-space matrix. An image may be generated from this matrix by performing a Fourier transformation of the matrix to convert this frequency information to spatial information representing the distribution of nuclear spins or density of nuclei of the image material.

Imaging time is largely a factor of desired signal-to-noise ratio (SNR) and the speed with which the MRI device can fill the k-space matrix. In conventional MRI, the k-space matrix is filled one line at a time. Although many improvements have been made in this general area, the speed with which the k-space matrix may be filled is limited. To overcome these inherent limits, several techniques have been developed to simultaneously acquire multiple lines of data for each application of a magnetic field gradient. These techniques, which may collectively be characterized as "parallel imaging techniques", use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

Two such parallel imaging techniques that have recently been developed and applied to in vivo imaging are SENSE (SENSitivity Encoding) and SMASH (simultaneous acquisition of spatial harmonics). Both techniques include the parallel use of a plurality of separate receiving elements, with each element having a different respective sensitivity profile, and combination of the respective spin resonance signals detected enables a reduction of the acquisition time required for an image (in comparison with conventional Fourier image reconstruction) by a factor which in the most favorable case equals the number of the receiving members used (see Pruessmann et al., *Magnetic Resonance in Medicine* Vol. 42, p.952–962, 1999).

A drawback of the SENSE technique, for example, results when the component coil sensitivities are either insufficiently well characterized or insufficiently distinct from one another. These instabilities may manifest as localized artifacts in the reconstructed image, or may result in degraded signal to noise ratio (SNR). Accordingly, it is desirable to implement RF coil arrays in MRI systems that (among other aspects) provide increased SNR with or without the use of parallel imaging techniques such as SENSE.

Additionally, image artifacts are also attributable due to the mutual couplings between coils in a cluster of closely situated surface coils, which have been separately tuned and matched. The mutual couplings between the coils generate coupled modes, which cause splitting in the coils' resonant spectrum. Consequently, the coils become detuned and mismatched, causing reductions in the SNR. To sustain the SNR of the coils and avoid image artifacts caused by coil coupling, some decoupling mechanisms are needed to degenerate the multiple coupled modes into a single mode that resonates at the MR frequency.

In a typical multiple coil array arrangement, several adjacent coils are provided for receiving signals during imaging. To limit or reduce a common problem of cross talk between adjacent coils, generally adjacent coils are overlapped and a low impedance preamplifier is used for the coils not contained within an overlapping pair. Due to the current-carrying paths established by each coil of the array, such overlapping and preamplifier configuration reduces and/or cancels mutual inductive coupling between the coils, thereby reducing cross talk.

Most recently, parallel spatial encoding techniques such as SMASH and SENSE and the like impose a new design criterion that the complex sensitivities of the phased array coils should be sufficiently orthogonal, or alternatively sufficiently distinct from one another. Conventional overlapping coil and preamplifier arrangements do not generally meet this requirement. Thus, there is a need for a method and apparatus for decoupling RF detector arrays for use in parallel imaging using MRI.

SUMMARY OF INVENTION

In a first aspect, a radio frequency (RF) detector array assembly for use in a magnetic resonance imaging (MRI)

system is provided. The RF detector array assembly comprises at least one array of RF detectors, wherein the array has a plurality of RF detector elements for use in acquiring radio frequency (RF) signals from the MRI system, and, a decoupling interface coupled to each of the plurality of detector elements for decoupling each detector element from the remaining detector elements.

In a second aspect, a method for decoupling radio frequency (RF) detector array elements in a magnetic resonance imaging (MRI) system is provided. The method comprises the steps of providing at least one RF detector array, wherein the detector array has a plurality of RF detector elements, and, providing a decoupling interface coupled to each of the plurality of detector elements for decoupling each detector element from the remaining detector elements.

BRIEF DESCRIPTIONS OF DRAWINGS

The features and advantages of the present invention will become apparent from the following detailed description of the invention when read with the accompanying drawings in which:

FIG. 1 is a schematic block diagram of an exemplary MR imaging system suitable for use with the present invention embodiments;

FIG. 2 a planar view of a detector array to which embodiments of the invention are applicable;

DETAILED DESCRIPTION

Figure 1:
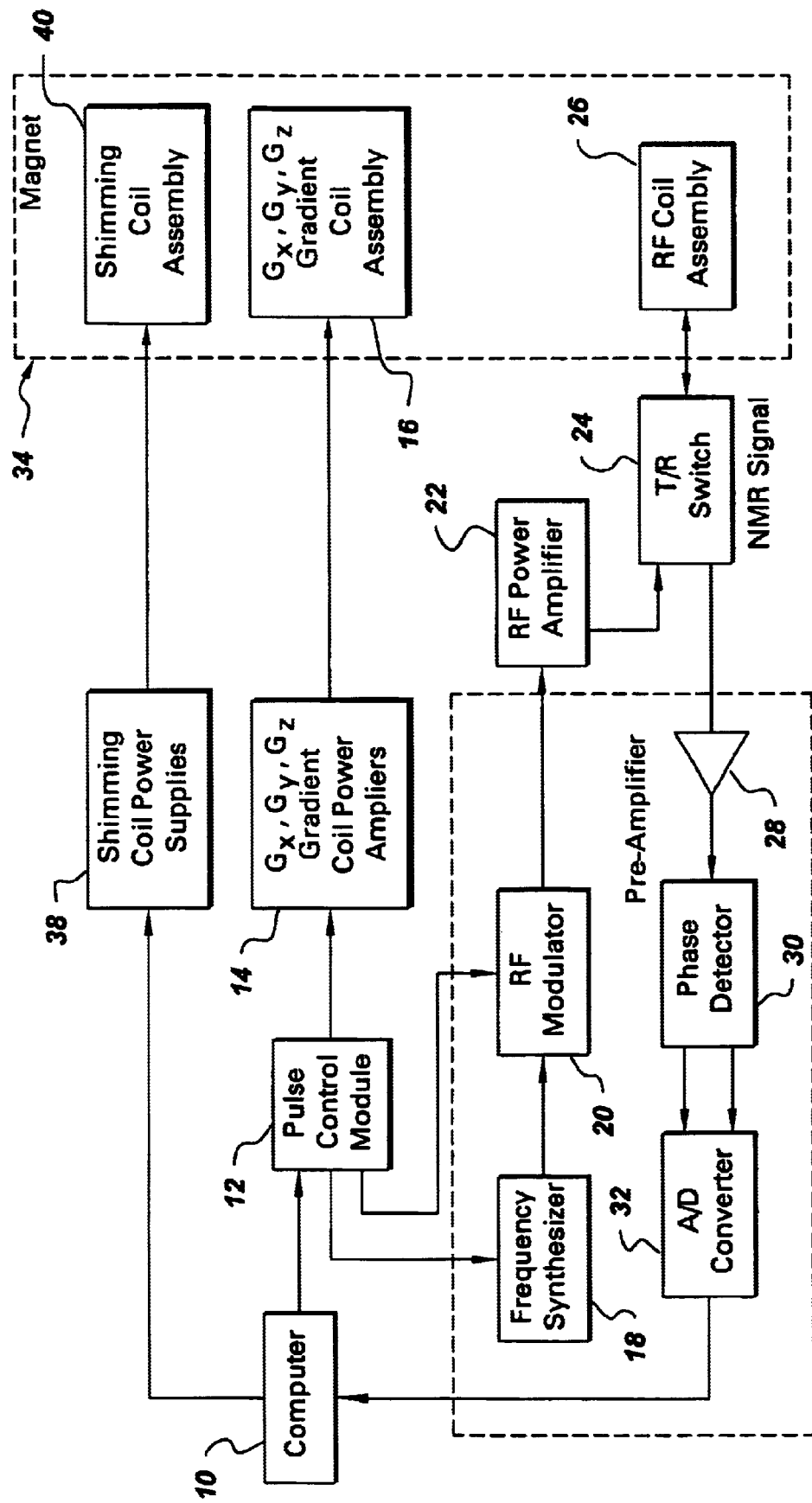

Referring initially to FIG. 1, an exemplary magnetic resonance (MR) imaging system includes a computer 10, which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16, which are positioned around the bore of an MR magnet assembly 34 so that gradients Gx, Gy, and Gz are impressed along their respective axes on the polarizing magnetic field $B_0$ from magnet assembly 34.

The pulse control module 12 also controls a radio frequency synthesizer 18 that is part of an RF transceiver system, portions of which are enclosed by dashed line block 36. The pulse control module 12 also controls an RF modulator 20, which modulates the output of the radio frequency synthesizer 18. The resultant RF signals, amplified by power amplifier 22 and applied to a RF coil assembly 26 through transmit/receive switch 24, are used to excite the nuclear spins of the imaged object (not shown).

The MR signals from the excited nuclei of the imaged object are picked up by RF coil assembly 26 and presented to preamplifier 28 through transmit/receive switch 24, to be amplified and then processed by a quadrature phase detector 30. The detected signals are digitized by a high speed A/D converter 32 and applied to computer 10 for processing to produce MR images of the object. Computer 10 also controls shimming coil power supplies 38 to power shimming coil assembly 40.

In embodiments of the present invention, RF coil assembly 26 is a RF detector array consisting of multiple detector elements, such as loops or conductive strips and may also be configured as an array of multiple coils or conductive strips. Other conductive materials and structures, for example copper rods, pipes, wires or other line structures, may also be used as detector elements. In a further embodiment, RF coil assembly 26 is a MRI phased array. An embodiment employing conductive strips will be described in greater detail below with reference to FIGS. 2 and 3. Also, in embodiment of the present invention, the detector elements may be non-overlapping or over-lapping.

In addition, the SNR may be even further improved by implementing a multiple channel array for receive coil assembly 26. In so doing, a parallel processing technique such as SENSE (described above) may then be used to improve data acquisition time. At relatively high $B_0$ field strengths (e.g., >3T), the homogeneity of the RF excitation field becomes largely dependent upon the electrical properties and size of the patient. However, if the transmit coil were also implemented in an array configuration, then the current amplitude and phase in each array element could be individually regulated such that the homogeneity of the RF excitation field is optimized in the presence of the patient.

Figure 2:
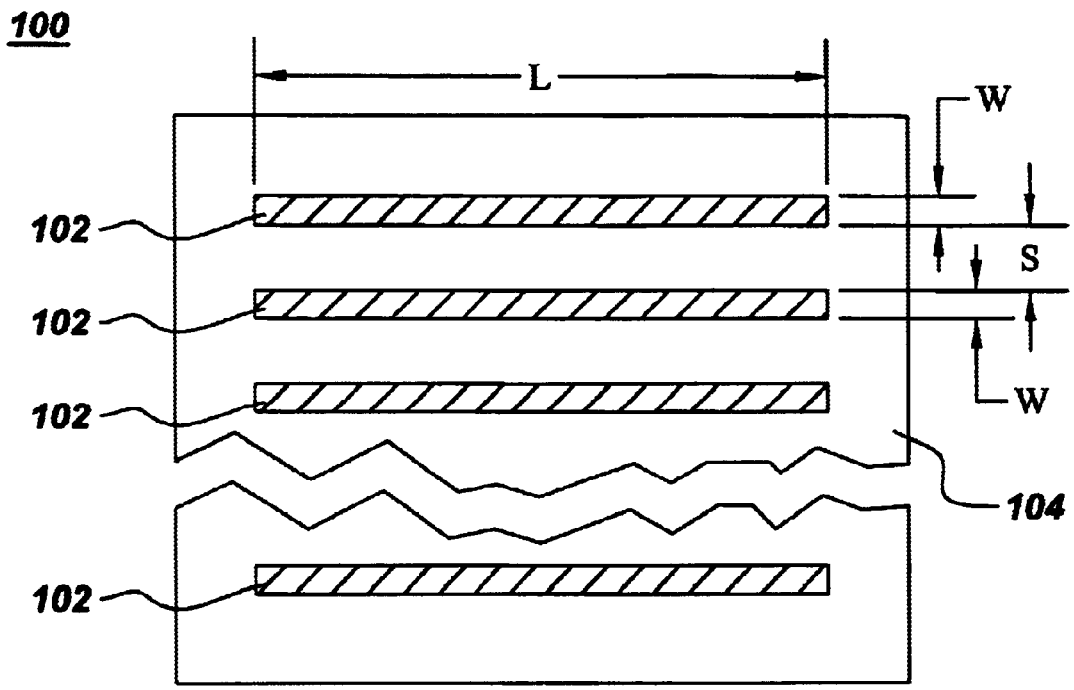

Referring now to FIG. 2, there is shown a planar view of a microstrip array 100 which may be subsequently configured in a generally planar configuration for RF detector applications such as a surface coil. Alternatively, microstrip array 100 may be configured in a cylindrical fashion to form a multiple channel volume resonator. The array 100 includes a series of parallel, commensurate-length conductive (e.g., copper) microstrips 102 having a dielectric overlay 104 thereon. The dielectric medium selected for the overlay 102 may be, for example, glass having a relative dielectric constant of $\epsilon_r=6.4$. The dielectric medium material reduces the electromagnetic frequency (EMF) wavelength by a factor of $\epsilon_r^{1/2}$ in order to make, for example, a quarter wavelength ($\lambda/4$) resonator at the MRI frequency correspond to a reasonable length for a receiving array. Thus, in a 1.5 Tesla (T) system with a proton resonance of 63.87 MHz, the quarter wavelength ($\lambda/4$) is reduced from 117 cm to 46 cm in the glass medium. It is to be appreciated that the microstrip configuration allows for isolation between each of the 16 individual array elements, thereby enabling each element to be driven individually if so desired. On the receiving end, the volume resonator may be used as either a 16-channel phased array for SNR improvement, or for parallel image processing techniques such as SENSE.

As described by Lee, et al. in *Magnetic Resonance in Medicine*, 45:673–683 (2001), the strip length *l* can be a quarter wavelength ($\lambda/4$) or a half wavelength ($\lambda/2$), while the strip width w, spacing s, and dielectric thickness h are chosen to make the characteristic impedance of the strip match the impedance of connecting cables thereto (not shown). One advantage of the microstrip array 100 over a conventional loop design is that the length of the strips 102 may be adjusted such that the coupling between the strips is minimized, regardless of the spacing s therebetween. In one embodiment, using a group of quarter wavelength ($\lambda/4$) strips (or integral multiples thereof) terminated by either an open circuit or a short circuit results in standing wave resonance within the strips. In an alternative embodiment, using a group of half wavelength ($\lambda/2$) strips (or integral multiples thereof) terminating with matched impedance loads results in traveling wave resonance within the strip. In both embodiments, the strips are decoupled from one another (as is described in greater detail by Lee, et al.), thereby providing high SNR on each of the isolated strips.

Figure 3:
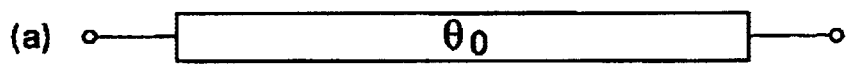
FIG. 3 is a schematic illustration of a pair of detector elements represented as transmission lines.
Figure 3:
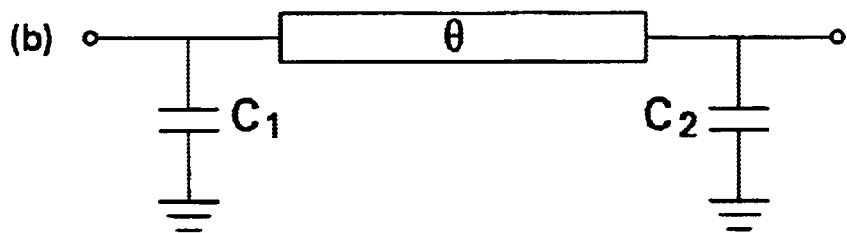

It should further be noted at this point that the actual physical length of the strip array may be allowed to vary, so long as the desired electrical wavelength of the strip is achieved. The physical length of the strip can be varied to alter the electrical wavelength of the strip. Generally, the electrical length $\theta$ 0 should desirably be $\pi/2$ or $\pi$, which requires the physical length be a quarter or a half, wavelength of the resonant wavelength. Practically, for a 7T whole body MRI scanner, the resonant wavelength in air is about 1 m, therefore the quarter wavelength of a conductive strip in air is 25 cm, which is a reasonable length for a RF detector inside a MRI scanner. However, for lower field MRI scanners (for example, 1.5 T), the resonant wavelength in air is 4.967 m. Thus, a quarter wavelength of a conductor strip in air is 1.17 m, which is too long to be an effective RF detector. To this end, for lower field MRI applications, lumped element reactances may be added to get the selected electrical wavelength. FIG. 3 schematically illustrates a pair of strips (a), (b) represented as transmission lines. In (a), the actual strip length I is equal to a desired electrical wavelength $\theta_0$ (e.g., $\lambda/4$, $\lambda/2$). With an appropriate termination, strip (a) will naturally be decoupled from a neighboring strip of the same length and termination. However, in strip (b), the actual strip length I is shorter than the desired electrical wavelength $\theta_0$, instead having an electrical wavelength $\theta$. In order to achieve the desired electrical wavelength $\theta_0$, lumped elements such as capacitors C1 and C2 may be added to strip (b).

Figure 4:
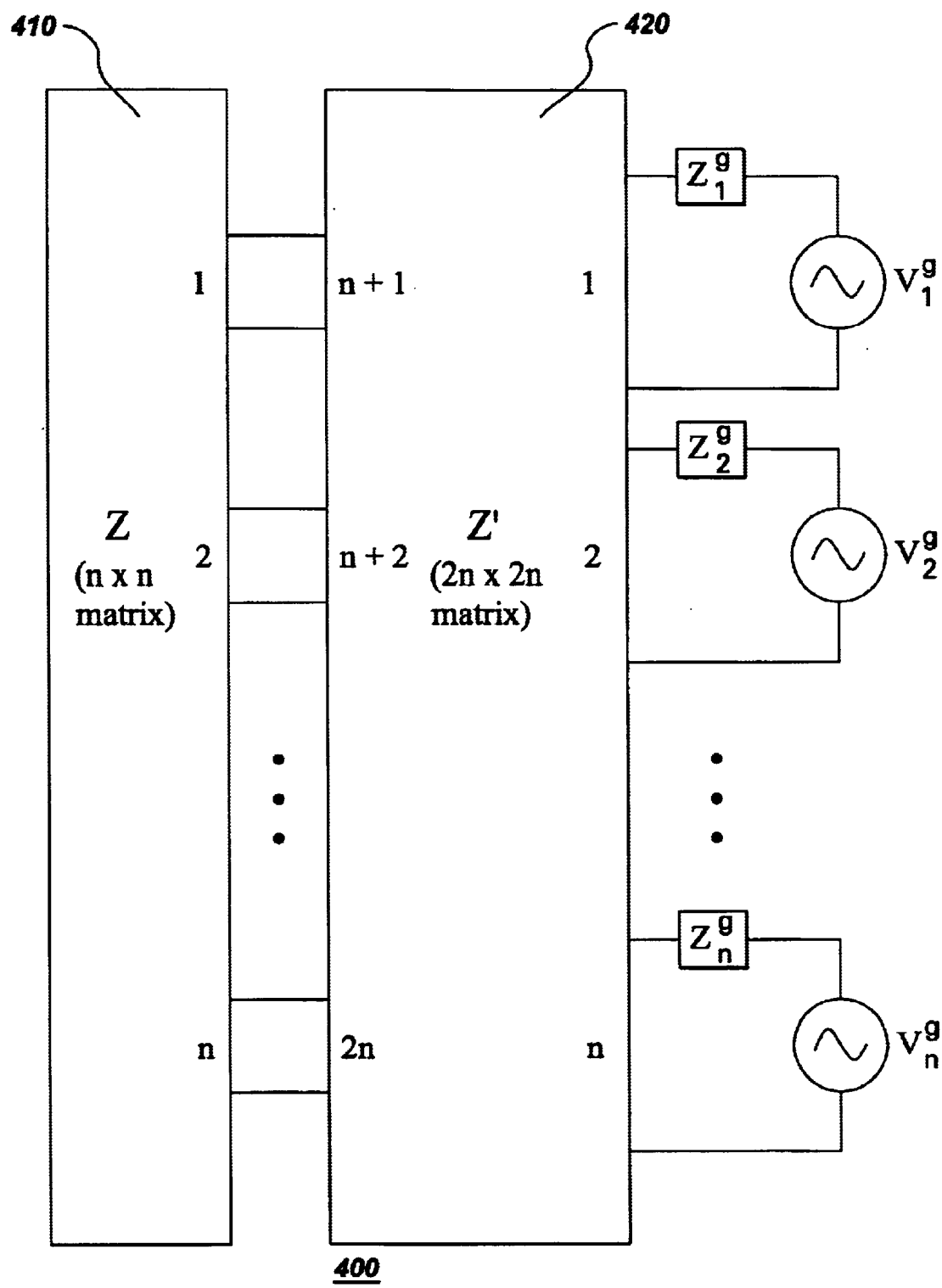
FIG. 4 is a schematic illustration of a RF detector array assembly in accordance with embodiments of the present invention.

Referring to FIG. 4, there is shown an embodiment of a RF detector array assembly 400 for use in parallel imaging. In an embodiment of the present invention, a radio frequency (RF) detector array assembly is provided for use in a MRI system. The RF detector array assembly comprises at least one RF detector array 410, as described above wherein the array has a plurality of RF detector elements for use in simultaneously acquiring RF signals from the MRI system, and a decoupling interface 420 coupled to each of the plurality of detector elements for decoupling each element from the remaining elements. As described above, the array may be a phased array, a multiple coil array or, alternatively, a microstrip array. The elements, for example coils or strips, may be non-overlapping or overlapping. In the embodiments described hereinafter, the coils and/or strips are referred to as "elements" and are non-overlapping. It is to be appreciated that the decoupling interface arrangement is also applicable to arrays having overlapping elements.

Referring further to FIG. 2, in an embodiment of the RF detector array, the array comprises a plurality of conductive strips 102 being substantially parallel to a conductive ground plane (not shown) and a plurality of capacitors C1 and C2 of FIG. 3, wherein at least one capacitor is shunted from each strip to the ground plane to adjust a corresponding electrical length of each conductive strip. The combination of each respective strip, at least one corresponding capacitor and the ground plane forms a resonator that resonates at a selected frequency.

In a further embodiment of the RF detector array, the array comprises a plurality of commensurate microstrips formed within a dielectric medium, each microstrip being adjusted to an integer multiple of a quarter-wavelength of a selected resonance wavelength by adjusting both strip length and a dielectric constant of the medium and at least one termination at each microstrip, the termination being selected from a group consisting of short circuit, open circuit, and reactive terminations.

As used herein, n-port systems represent n-element array for use in detecting RF signals in a MRI system. The system further has a number n or ports for coupling to, for example, source generators. In transmit mode, the source generators are the equivalent voltage or current sources at the outputs of power amplifiers to the MRI system. Alternatively, in receive mode, by use of the reciprocity principle, the source generators represent the signals at preamplifier inputs of the MRI system.

For a coupled system, let V and I be the vectors of the voltages and currents measured at the ports. Z and Y are the open-circuit impedance and admittance matrices of the n-port system:

$$V = \begin{pmatrix} V_1 \\ \vdots \\ V_n \end{pmatrix}, \quad I = \begin{pmatrix} I_1 \\ \vdots \\ I_n \end{pmatrix}, \quad Z = \begin{pmatrix} Z_{11} & \cdots & Z_{1n} \\ \vdots & \ddots & \vdots \\ Z_{n1} & \cdots & Z_{nn} \end{pmatrix}, \quad Y = Z^{-1}, \quad [1]$$

where the diagonal component $Z_{ii}$ (i=1,2, ..., n) is the self-impedance of the $i^{th}$ element (typically a "tuned and matched" coil) when all other ports are open-circuited. The real part of $Z_{ii}$ represents transformed resistive losses in the element (e.g. sample losses) while the imaginary part is the transformed reactance of the element. The mutual impedance $Z_{ij}$ (i,j=1,2, ..., n; i≠j) between two ports i and j is the open circuit voltage produced at the $i^{th}$ port divided by the current supplied to the $j^{th}$ port when all other ports are open-circuited. The real part of $Z_{ij}$ is the mutual resistance (associated with noise correlation) between coil elements i and j, and the imaginary part of $Z_{ij}$ is the reactive coupling, which is mainly inductive coupling between coil elements i and j. Thus, the nodal equation of the coupled n-port system itself, not including the source generators, is $$V = ZI. \quad [2]$$

The uncoupled system can be treated as a special case of the general coupled system. Let $V^u$ and $I^u$ be the voltage and current vectors measured at the ports in the uncoupled system. $Z^u$ and $Y^u$ are the open-circuit impedance and admittance matrices for the uncoupled system:

$$V^u = \begin{pmatrix} V_1^u \\ \vdots \\ V_n^u \end{pmatrix}, \quad I^u = \begin{pmatrix} I_1^u \\ \vdots \\ I_n^u \end{pmatrix}, \quad Z^u = \begin{pmatrix} Z_{11}^u & 0 & \cdots & 0 \\ 0 & Z_{22}^u & \cdots & 0 \\ \vdots & & \ddots & \vdots \\ 0 & 0 & \cdots & Z_{nn}^u \end{pmatrix}, \quad Y^u = (Z^u)^{-1}. \quad [3]$$

Thus, the nodal equation of the uncoupled system becomes $$V^u = Z^u I^u. \quad [4]$$

In the closed circuit where the source generators are included, the generator voltages and currents are $$V^g = \begin{pmatrix} V_1^g \\ V_2^g \\ \vdots \\ V_n^g \end{pmatrix}, \quad I^g = \begin{pmatrix} I_1^g \\ I_2^g \\ \vdots \\ I_n^g \end{pmatrix}. \quad [5]$$

The generator impedance and admittance are $$Z^g = \begin{pmatrix} Z_1^g & 0 & \cdots & 0 \\ 0 & Z_2^g & & 0 \\ \vdots & & \ddots & \vdots \\ 0 & 0 & \cdots & Z_n^g \end{pmatrix}, \quad Y^g = (Z^g)^{-1}. \quad [6]$$

Based on Kirchhoff's law, the coupled system of FIG. 1 can be described by $$V^g = V + Z^g I, \quad I^g = I + Y^g V. \quad [7]$$

The uncoupled system can be described by $$V^g = V^u + Z^g I^u, \quad I^g = I^u + Y^g V^u. \quad [8]$$

Equations [7] and [8] are the foundation for developing the relations between the coupled and uncoupled phased array.

Equation [7] is the complete description of a coupled system. Equation [8] is the complete description of an uncoupled system. By equating the source generators in Eq. [7] and Eq. [8], the explicit relations between V and $V^u$, or alternatively, I and $I^u$ are derived.

Based on the open-circuit nodal equations, Eqs. [2] and [4], and closed-circuit Kirchhoff's law, Eqs. [7] and [8], it is found that $$\begin{cases} I^g = (Y + Y^g)V \\ I^g = (Y^u + Y^g)V^u \end{cases}, \quad [9]$$

which results in the relation between the uncoupled voltage $V^u$ and the coupled voltage V, $$(Y+Y^g)V = (Y^u+Y^g)V^u. \quad [10]$$

Let matrix $C_v$ be the transform matrix from uncoupled voltages to coupled voltages, and $D_v$ be the transform matrix from coupled voltages to uncoupled voltages. Then Eq. [10] becomes either $$V = C_v V^u, \text{ or } V^u = D_v V, \quad [11]$$

where $D_v$ is the inverse of $C_v$, and $$C_v = (Y+Y^g)^{-1}(Y^u+Y^g)$$

$$D_v = (Y^u+Y^g)^{-1}(Y+Y^g) \quad [12].$$

Here $C_v$ is called the voltage coupling matrix, and $D_v$ is called the voltage decoupling matrix.

In a similar fashion manner, the current relationships are derived from Equations [2], [4], [7], and [8], as follows:

$$\begin{cases} V^g = (Z + Z^g)I \\ V^g = (Z^u + Z^g)I^u \end{cases}, \quad [13]$$

which results in the relation between the uncoupled current $I^u$ and the coupled current I, $$(Z+Z^g)I = (Z^u+Z^g)I^u. \quad [14]$$

Let matrix $C_I$ be the transform matrix from uncoupled currents to coupled currents, and $D_I$ be the transform matrix from coupled currents to uncoupled currents. Then Equation [14] becomes either $$I = C_I I^u, \text{ or } I^u = D_I I, \quad [15]$$

where $D_I$ is the inverse of $C_I$, and $$C_I = (Z+Z^g)^{-1}(Z^u+Z^g)$$

$$D_I = (Z^u+Z^g)^{-1}(Z+Z^g) \quad [16].$$

Here $C_I$ is called the current coupling matrix, and $D_I$ is called the current decoupling matrix.

The coupling of an n-port system can be fully characterized by the voltage and the current coupling matrices $C_V$ and $C_I$. Each eigenvalue of $C_V$ or $C_I$ represents one coupled mode. Since $C_V$ or $C_I$ is an n×n matrix, if there is no degeneracy, then there can be n coupled modes, which suggests that coupling could cause the system's resonance frequency to split into n different frequencies. One way to handle MR signals in such a coupled system is to include an additional decoupling mechanism to degenerate the multiple resonant modes of the system into one mode.

In embodiments of the present invention, It is possible that a coupled n-port system with impedance matrix Z is transformed into a decoupled n-port system $Z^u$ by a 2 n-port interface system with impedance matrix Z', as illustrated in FIG. 4. Z' is a 2 n×2 n matrix, expressed as follows $$Z' = \begin{pmatrix} Z'_{11} & \cdots & Z'_{1n} & Z'_{1(n+1)} & \cdots & Z'_{1(2n)} \\ \vdots & \ddots & \vdots & \vdots & \ddots & \vdots \\ Z'_{n1} & \cdots & Z'_{nn} & Z'_{n(n+1)} & \cdots & Z'_{n(2n)} \\ Z'_{(n+1)1} & \cdots & Z'_{(n+1)n} & Z'_{(n+1)(n+1)} & \cdots & Z'_{(n+1)(2n)} \\ \vdots & \ddots & \vdots & \vdots & \ddots & \vdots \\ Z'_{(2n)1} & \cdots & Z'_{(2n)n} & Z'_{(2n)(n+1)} & \cdots & Z'_{(2n)(2n)} \end{pmatrix}. \quad [17]$$

Let the four n×n submatrices of Z' be $$\hat{Z}'_{11} = \begin{pmatrix} Z'_{11} & \cdots & Z'_{1n} \\ \vdots & \ddots & \vdots \\ Z'_{n1} & \cdots & Z'_{nn} \end{pmatrix}, \quad \hat{Z}'_{12} = \begin{pmatrix} Z'_{1(n+1)} & \cdots & Z'_{1(2n)} \\ \vdots & \ddots & \vdots \\ Z'_{n(n+1)} & \cdots & Z'_{n(2n)} \end{pmatrix}, \quad [18]$$

$$\hat{Z}'_{21} = \begin{pmatrix} Z'_{(n+1)1} & \cdots & Z'_{(n+1)n} \\ \vdots & \ddots & \vdots \\ Z'_{(2n)1} & \cdots & Z'_{(2n)n} \end{pmatrix},$$

$$\hat{Z}'_{22} = \begin{pmatrix} Z'_{(n+1)(n+1)} & \cdots & Z'_{(n+1)(2n)} \\ \vdots & \ddots & \vdots \\ Z'_{(2n)(n+1)} & \cdots & Z'_{(2n)(2n)} \end{pmatrix},$$

The nodal equation of the n-port system is V=ZI, Eq. [4]. The nodal equation of the 2n-port interface system is $$\begin{pmatrix} V' \\ V'' \end{pmatrix} = \begin{pmatrix} \hat{Z}'_{11} & \hat{Z}'_{12} \\ \hat{Z}'_{21} & \hat{Z}'_{22} \end{pmatrix} \begin{pmatrix} I' \\ I'' \end{pmatrix}, \quad [19]$$

where

-continued $$V' = \begin{pmatrix} V'_1 \\ \vdots \\ V'_n \end{pmatrix}, \quad V'' = \begin{pmatrix} V'_{n+1} \\ \vdots \\ V'_{2n} \end{pmatrix}, \quad I' = \begin{pmatrix} I'_1 \\ \vdots \\ I'_n \end{pmatrix}, \quad I'' = \begin{pmatrix} I'_{n+1} \\ \vdots \\ I'_{2n} \end{pmatrix}. \quad [20]$$

Note that at the interconnections between the n-port system and the 2n-port interface, we have $$V''=V, \; I''=-I. \quad [21]$$

Thus, from Eqs. [4], [19], and [21], the output impedance matrix of the interface is derived as $$Z_{out} = \frac{V'}{I'} = \hat{Z}'_{11} - \hat{Z}'_{12}(\hat{Z}'_{22} + Z)^{-1}\hat{Z}'_{21}. \quad [22]$$

When the output impedance matrix is equal to the impedance matrix of the uncoupled system, $Z_{out}=Z^u$, then Eq. [22] becomes the decoupling equation, $$\hat{Z}'_{11}-\hat{Z}'_{12}(\hat{Z}'_{22}+Z)^{-1}\hat{Z}'_{21}=Z^u. \quad [23]$$

Any 2 n-port interface that satisfies Eq. [23] can be used to decouple an n-port coupled system Z.

Thus, Z is an n×n matrix, due to the reciprocity of the passive network, $Z_{ij}=Z_{ji}$ (i,j=1, 2, . . . , n; i≠j), and there are n(n+1)/2 independent equations in Eq. [23]. It can also be reasonable to assume that the diagonal elements of Z are identical $Z_{11}=Z_{22}=\ldots =Z_{nn}$ (which is a reasonable assumption if every coil element in the phased array is matched to the same value, for example 50Ω, then the number of independent equations in Eq. [23] becomes 1+n(n−1)/2. On the other hand, the matrix Z' is a 2 n×2 n matrix, and so if it also has the reciprocity of a passive network and identical diagonal elements, it has 1+2 n (2 n−1)/2 unknowns. Because the number of unknowns is larger than the number of independent equations, the decoupling equation Eq. [23] has more than one set of solutions, which means that there is more than one way to construct the decoupling network.

However, there is one special class of highly degenerate 2 n-port structures which has higher symmetry, namely $$\hat{Z}'_{11}=\hat{Z}'_{12}=\hat{Z}'_{21}=\hat{Z}'_{22}. \quad [24]$$

Under this condition, the number of unknowns is equal to the number of independent equations in Eq. [23]. Therefore the decoupling equation can be solved without other assumptions in the solutions. An interface system with such symmetry is the most degenerate system possible, making the construction of such an interface relatively easy.

In an exemplary embodiment, a four-port decoupling interface was used to decouple two strongly coupled coils and was experimentally demonstrated with both a network analyzer and a MRI scanner. In the experimental results, the coupling measured between two identical surface coils was −1.4 dB when they were unloaded, and 5 dB when they were loaded with a human chest. After inserting a decoupling interface, the coupling S21 reduced to −33 dB when they were unloaded, and −51 dB when they were loaded with a human chest. This means that there is only about 0.3% signal-power cross-talk between the two coils assuming that the input impedance of the preamplifier is 50Ω.

Figure 5:
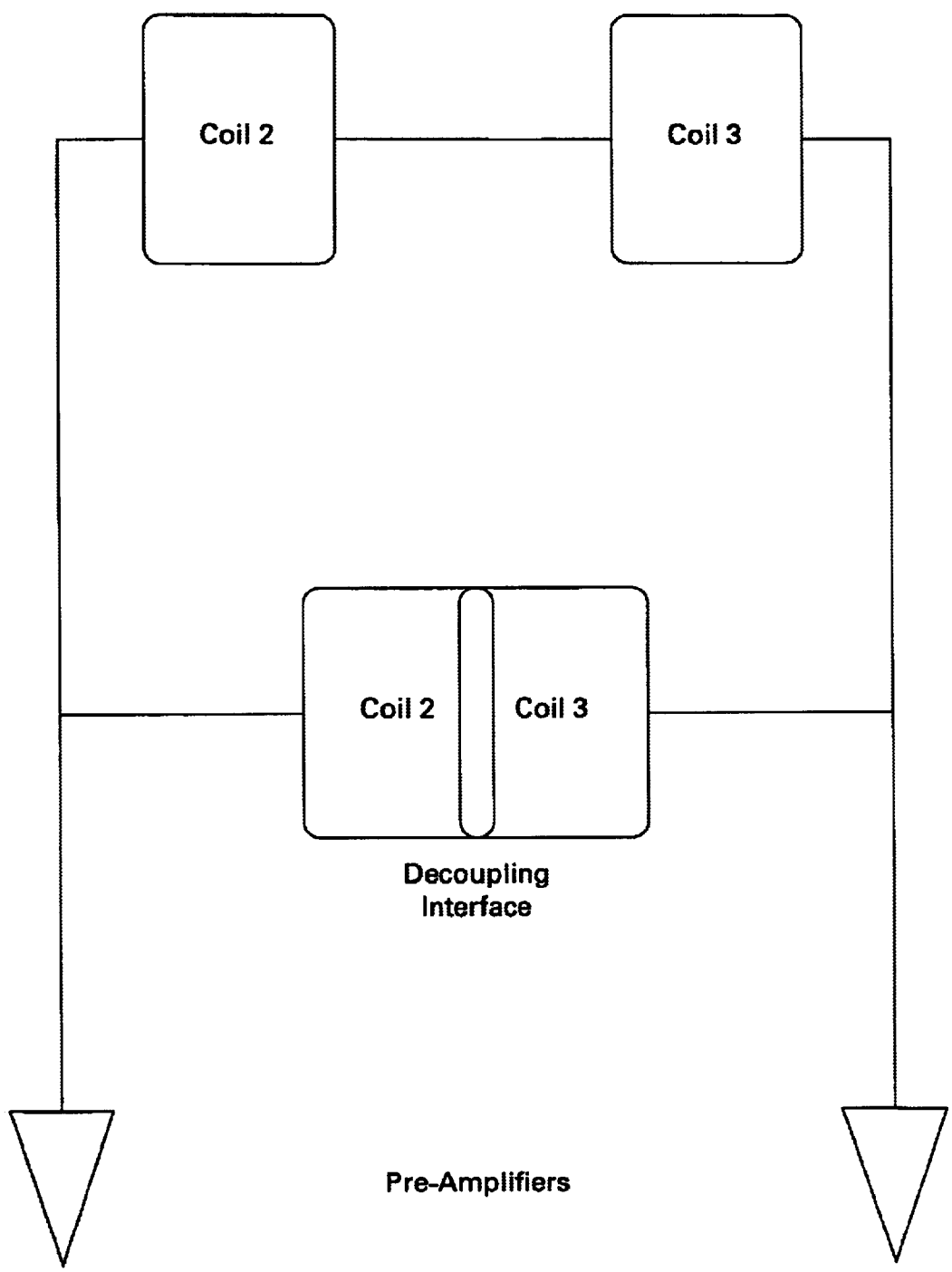
FIG. 5 is a schematic illustration of an exemplary RF detector array assembly in accordance with an embodiment of the present invention.

In this exemplary embodiment, each coil was constructed with 0.25 mm thick and 602 g/m² flexible printed circuit board. A total of four such coils were separately tuned at 63.66 MHz, and matched to 50Ω when they were loaded with a human chest. The two coils, coil 1 and 2, were laid side-by-side without any overlapping, and placed on a fixture to serve as an MRI RF detector. The separation between these two coils was 7 mm. A half wavelength coaxial cable is connected to each coil via a balun. The strong coupling between these two coils was recorded by an HP 4395A impedance/network analyzer (Hewlett Packard, Palo Alto, Calif.) and by an MRI scanner GE Lx (GEMS, Milwaukee, Wis. The decoupling interface in this experiment was made from two coils, coil 3 and coil 4, which are outside the magnet of the MRI scanner. Coil 3 is connected with both coil 1 and a preamplifier with a BNC T-connector, and coil 4 is connected with both coil 2 and another preamplifier with another T-connector. Adjusting the overlap between coil 3 and coil 4 can achieve the proper mutual reactance to decouple coil 1 and coil 2. Note that the reason for using two coils as a decoupling interface is because they are relatively easy to adjust to show a variety of coupling and decoupling phenomena, and because no extra matching is needed for every adjustment. However, it is to be appreciated that the interfaces may also be constructed with lumped-element circuits to minimize losses in the interface, such as interface would need to be inserted before any matching is performed. FIG. 5 is a schematic illustration of this exemplary embodiment.

In further embodiments, decoupling interface 420 may comprise reactive lumped-element circuits, distributive structures, transmission lines and coils.

Figure 6:
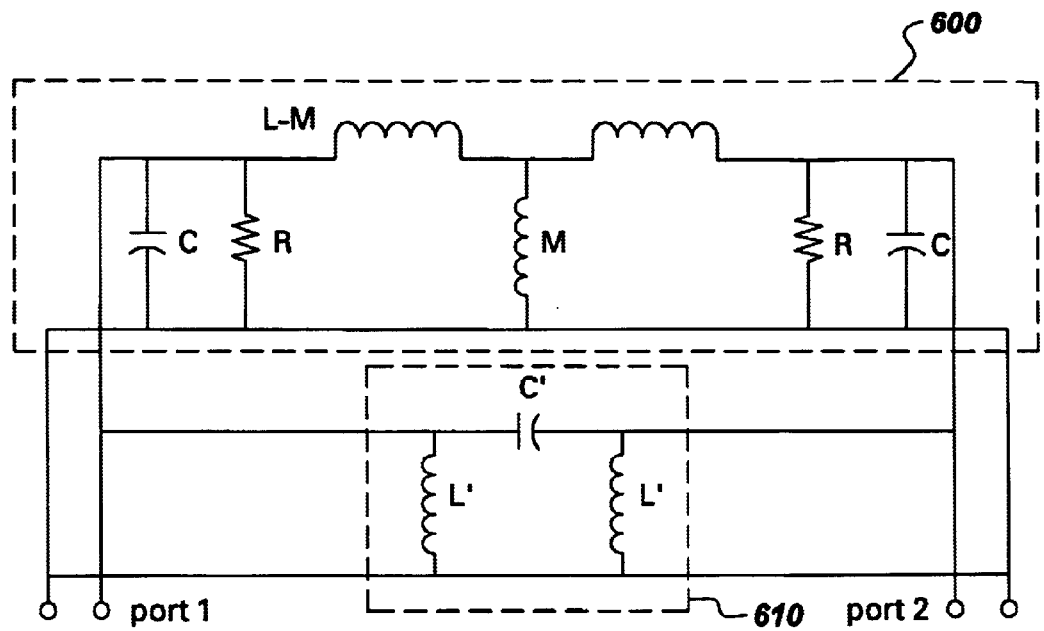
FIGS. 6–8 are schematic illustrations of exemplary decoupling interfaces in accordance with embodiments of the present invention; and, FIG. 9 is a schematic block diagram of a further embodiment of a RF detector array.
Figure 7:
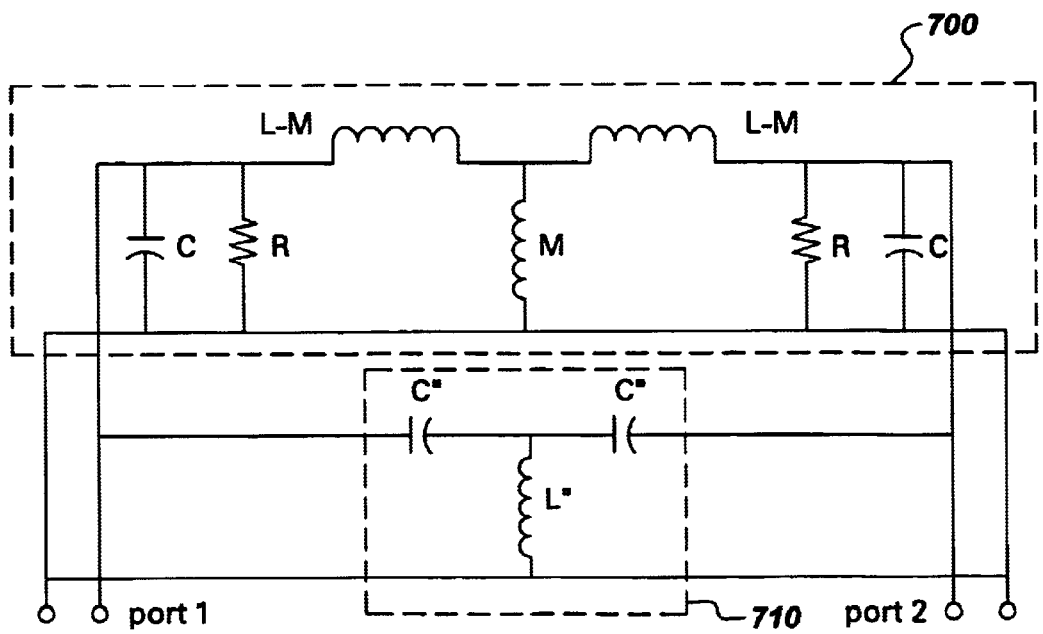

Referring to FIGS. 6 and 7, there is shown exemplary decoupling interfaces. FIG. 6 shows a π-circuit 610 acting as a decoupling interface for coil circuit 600, which is an equivalent circuit for two coils (Coil 1 and 2) of an array as described in FIG. 5. FIG. 7 shows a T-circuit 710 acting as a decoupling interface for coil circuit 700, which is also an equivalent circuit for the two coils Coil 1 and 2 of the array shown in FIG. 5.

Figure 8:
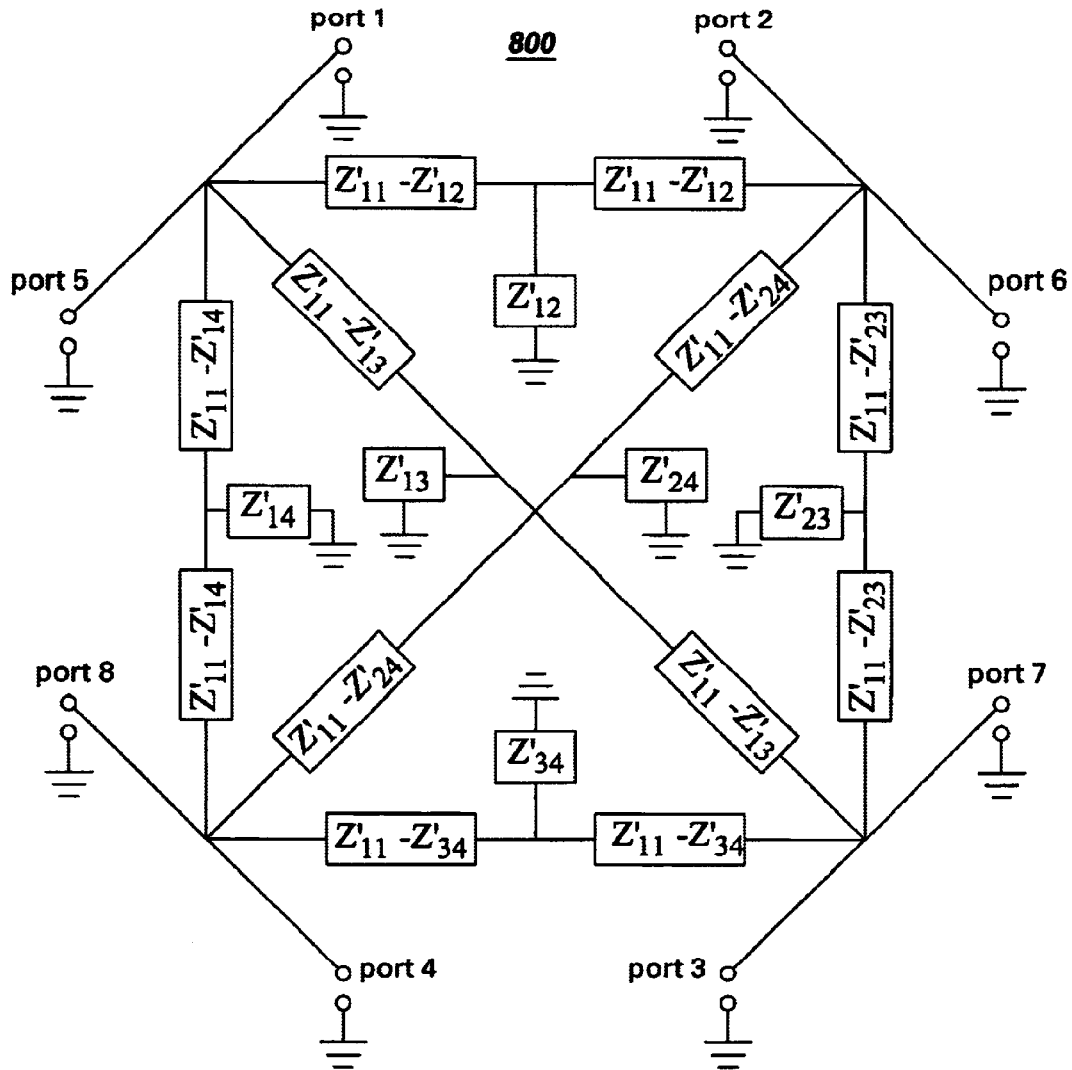

Referring to FIG. 8, there is shown a block diagram of an eight-port decoupling interface for decoupling a four-element phased array 800. This interface is assembled from six four-port interfaces.

Figure 9:
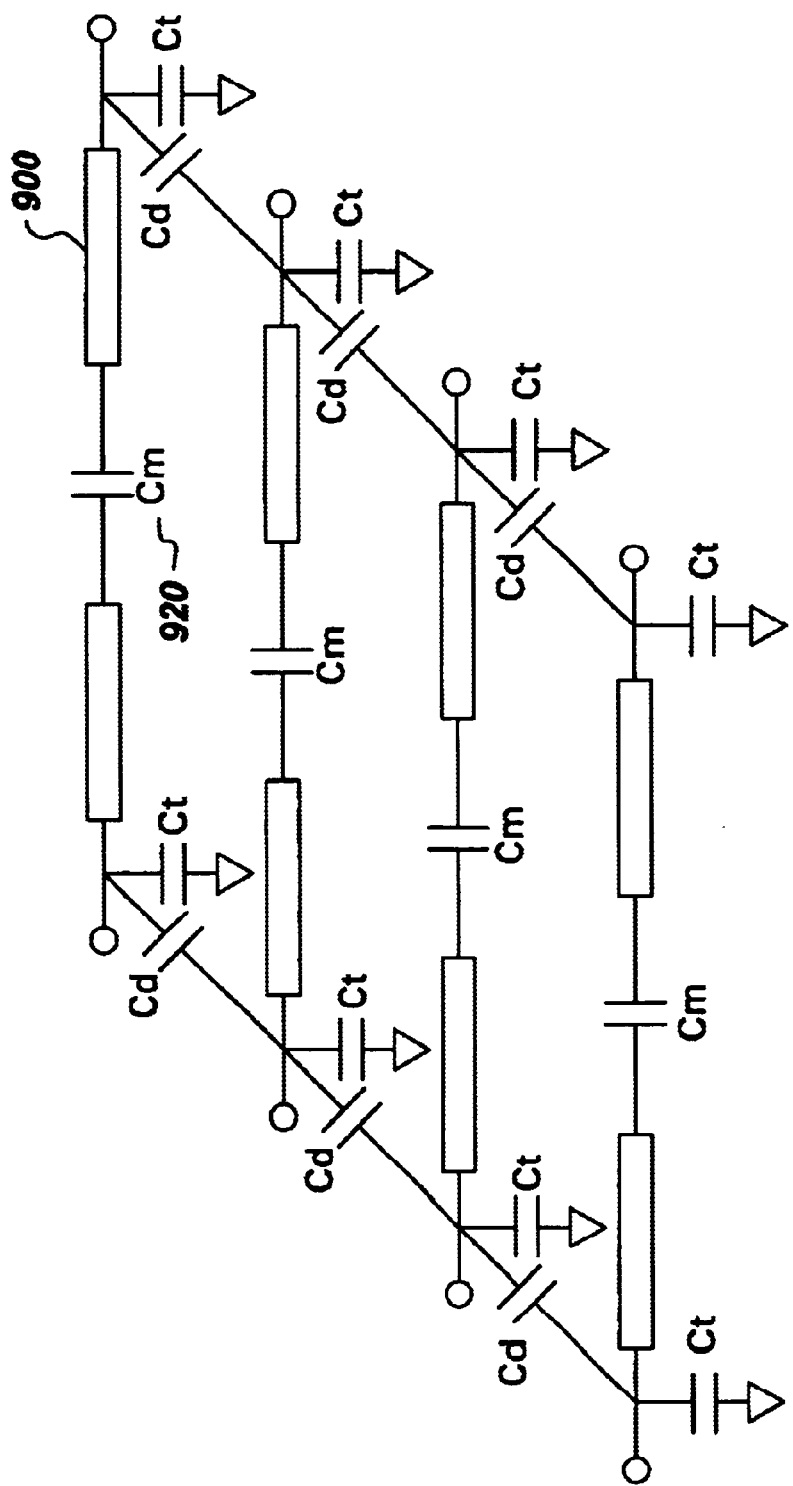

Referring to FIG. 9, there is shown a block diagram of a further embodiment of a RF detector array showing tuning capacitors 910 in shunt connection with a ground plane (not shown), matching capacitors 920 between conductive element segments 900 and decoupling capacitors 930 for interconnecting as described above.

In a further embodiment of the present invention, a method for decoupling radio frequency (RF) detector array elements in a magnetic resonance imaging (MRI) system is provided. The method comprises the steps of providing at least one of a RF detector array and providing a decoupling interface coupled to each of the plurality of detector elements for decoupling each detector element from the remaining detector elements. The RF detector array has a plurality of RF detector elements. In one embodiment, the detector elements are non-overlapping. In another embodiment, the detector elements are overlapping.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A radio frequency (RF) detector array assembly for use in a magnetic resonance imaging (MRI) system comprising:

at least one RF detector array, said array having a plurality of RF detector elements for use in simultaneously acquiring radio frequency (RF) signals from the MRI system; and, a decoupling interface coupled to each of said plurality of detector elements for decoupling each detector element from the remaining detector elements;

wherein the at least one array comprises:

a plurality of conductive structures being substantially parallel to a conductive ground plane;

a plurality of capacitors, wherein at least one capacitor is shunted from each structure to the ground plane to adjust a corresponding electrical length of each conductive structure; and, wherein a combination of each respective structure, at least one corresponding capacitor and the ground plane forms a resonator that resonates at a selected frequency.

2. A radio frequency (RF) detector array assembly for use in a magnetic resonance imaging (MRI) system comprising:

at least one RF detector array, said array having a plurality of RF detector elements for use in simultaneously acquiring radio frequency (RF) signals from the MRI system; and a decoupling interface coupled to each of said plurality of detector elements for decoupling each detector element from the remaining detector elements;

wherein the at least one detector array comprises:

a plurality of microstrips formed within a dielectric medium, each microstrip being adjusted to an integer multiple of a quarter-wavelength of a selected resonance wavelength by adjusting both strip length and a dielectric constant of the medium; and a termination end of each microstrip, the termination being selected from a group consisting of short circuit, open circuit, and reactive terminations.

3. A radio frequency (RF) detector array assembly for use in a magnetic resonance imaging (MRI) system comprising:

at least one RF detector array, said array having a plurality of RF detector elements for use in simultaneously acquiring radio frequency (RF) signals from the MRI system wherein a number of RF detector elements is n and the decoupling interface comprises a 2n-port interface and is further coupled to multiple transmit/receive channels, a decoupling interface coupled to each of said plurality of detector elements for decoupling each detector element from the remaining detector elements; and, wherein said decoupling interface satisfies a decoupling equation:

$$\hat{Z}_{11}' - \hat{Z}_{12}'(\hat{Z}_{22}' + Z)^{-1}\hat{Z}_{21}' = Z'',$$

where Z is a n×n impedance matrix for a n-port system of a n-element RF detector array, Z' is an 2n×2n impedance matrix for the decoupling interface, $\hat{Z}_{11}'$, $\hat{Z}_{12}'$, $\hat{Z}_{21}'$, and $\hat{Z}_{22}'$ are four n×n submatrices of Z', Z'' is an n×n impedance matrix for a decoupled n-port system of the n-element RF detector array.

4. A method for decoupling radio frequency (RF) detector array elements in a magnetic resonance imaging (MRI) system, the method comprising:

providing at least one RF detector array, said detector array having a plurality of RF detector elements; and, providing a decoupling interface coupled to each of said plurality of detector elements for decoupling each detector element from the remaining detector elements;

wherein the at least one detector array comprises:

a plurality of microstrips formed within a dielectric medium, each microstrip being adjusted to an integer multiple of a quarter-wavelength of a selected resonance wavelength by adjusting both strip length and a dielectric constant of the medium; and a termination end at each microstrip, the termination being selected from a group consisting of short circuit, open circuit, and reactive terminations.

5. The method of claim 4 wherein the RF detector elements are non-overlapping.

6. The method of claim 4 wherein the RF detector elements are overlapping.

7. The method of claim 4 wherein a number of RF detector elements is n and the decoupling interface comprises a 2n-port interface and is further coupled to multiple transmit/receive channels.

8. The method of claim 4 wherein the decoupling interface comprises at least one of reactive lumped-element circuits, distributive structures, transmission lines and coils.

9. The method of claim 4 wherein the RF detector array is employed as a volume coil.

10. The method of claim 4 wherein the RF detector array is employed as a surface coil.

11. The method of claim 4 wherein said decoupling interface satisfies the equation:

$$\hat{Z}_{11}' - \hat{Z}_{12}'(\hat{Z}_{22}' + Z)^{-1}\hat{Z}_{21}' = Z'',$$

where Z is a n×n impedance matrix for a n-port system of a n-element RF detector array, Z' is an 2n×2n impedance matrix for the decoupling interface, $\hat{Z}_{11}'$, $\hat{Z}_{12}'$, $\hat{Z}_{21}'$, and $\hat{Z}_{22}'$ are four n×n submatrices of Z', Z'' is an n×n impedance matrix for a decoupled n-port system of the n-element RF detector array.

12. A method for decoupling radio frequency (RF) detector array elements in a magnetic resonance imaging (MRI) system, the method comprising:

providing at least one RF detector array, said detector array having a plurality of RF detector elements; and, providing a decoupling interface coupled to each of said plurality of detector elements for decoupling each detector element from the remaining detector elements wherein the RF detector one array comprises:

a plurality of conductive structures being substantially parallel to a conductive ground plane;

a plurality of capacitors, wherein at least one capacitor is shunted from each structures to the ground plane to adjust a corresponding electrical length of each conductive strip; and, wherein a combination of each respective structures, at least one corresponding capacitor, and the ground plane forms a resonator that resonates at a selected frequency.

13. The method of claim 12 wherein the RF detector array further comprises a plurality of capacitors connected in a series connection of multiple sections within each strip.

14. The method of claim 12 wherein the RF detector array further comprises a plurality of capacitors interconnected between each strip and respective neighbor strips.

* * * * *